(12) United States Patent
Furusawa

(10) Patent No.: US 10,573,518 B2
(45) Date of Patent: Feb. 25, 2020

(54) FILM FORMING METHOD AND VERTICAL THERMAL PROCESSING APPARATUS

(71) Applicant: TOKYO ELECTRON LIMITED, Tokyo (JP)

(72) Inventor: Yoshikazu Furusawa, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/933,760

(22) Filed: Mar. 23, 2018

(65) Prior Publication Data
US 2018/0286665 A1 Oct. 4, 2018

(30) Foreign Application Priority Data
Mar. 29, 2017 (JP) .................. 2017-066088

(51) Int. Cl.
| | | |
|---|---|---|
| *H01L 21/02* | (2006.01) | |
| *C23C 16/44* | (2006.01) | |
| *H05B 1/02* | (2006.01) | |
| *H01L 21/67* | (2006.01) | |

(52) U.S. Cl.
CPC ...... *H01L 21/0262* (2013.01); *C23C 16/4404* (2013.01); *C23C 16/4405* (2013.01); *H01L 21/02532* (2013.01); *H01L 21/67017* (2013.01); *H01L 21/67109* (2013.01); *H05B 1/0233* (2013.01); *H01L 21/02658* (2013.01)

(58) Field of Classification Search
None
See application file for complete search history.

(56) References Cited

U.S. PATENT DOCUMENTS

| | | | |
|---|---|---|---|
| 2006/0216941 A1* | 9/2006 | Hasebe ............. | H01L 21/31116 438/715 |
| 2010/0210094 A1* | 8/2010 | Furusawa ............... | C23C 16/24 438/493 |
| 2010/0212581 A1* | 8/2010 | Noro ................... | C23C 16/0236 117/97 |

FOREIGN PATENT DOCUMENTS

JP       2010219494 A       9/2010

* cited by examiner

*Primary Examiner* — Bo B Jang
(74) *Attorney, Agent, or Firm* — Nath, Goldberg & Meyer; Jerald L. Meyer

(57) ABSTRACT

A method of performing a film formation on target substrates in a state where a substrate holder for holding the target substrates in a shelf shape is loaded into a vertical reaction container from a lower opening thereof and the lower opening is closed by a lid. The method includes: performing the film formation on the target substrates by supplying a processing gas into the reaction container; opening the lid and unloading the substrate holder from the reaction container; performing the film formation on a bottom portion of the reaction container including an inner surface of the lid by closing the lower opening with the lid and supplying a coating gas different from the processing gas into the reaction container; and performing the film formation on the target substrates by opening the lid, loading the substrate holder into the reaction container, and supplying the processing gas into the reaction container.

7 Claims, 4 Drawing Sheets

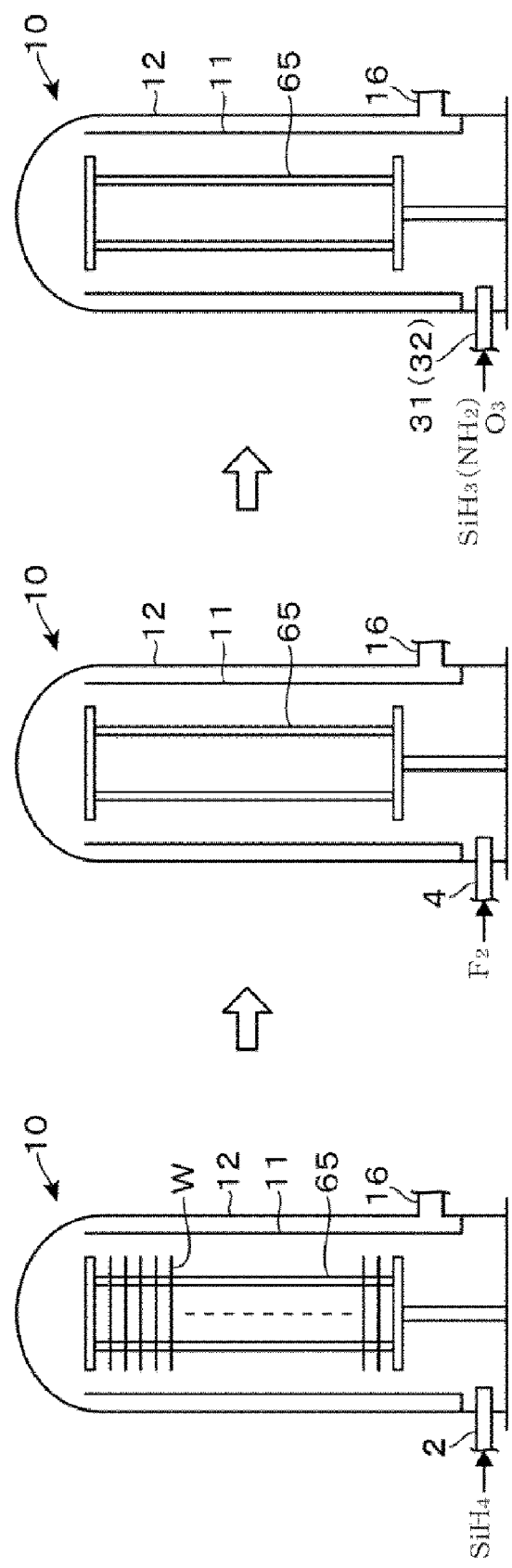

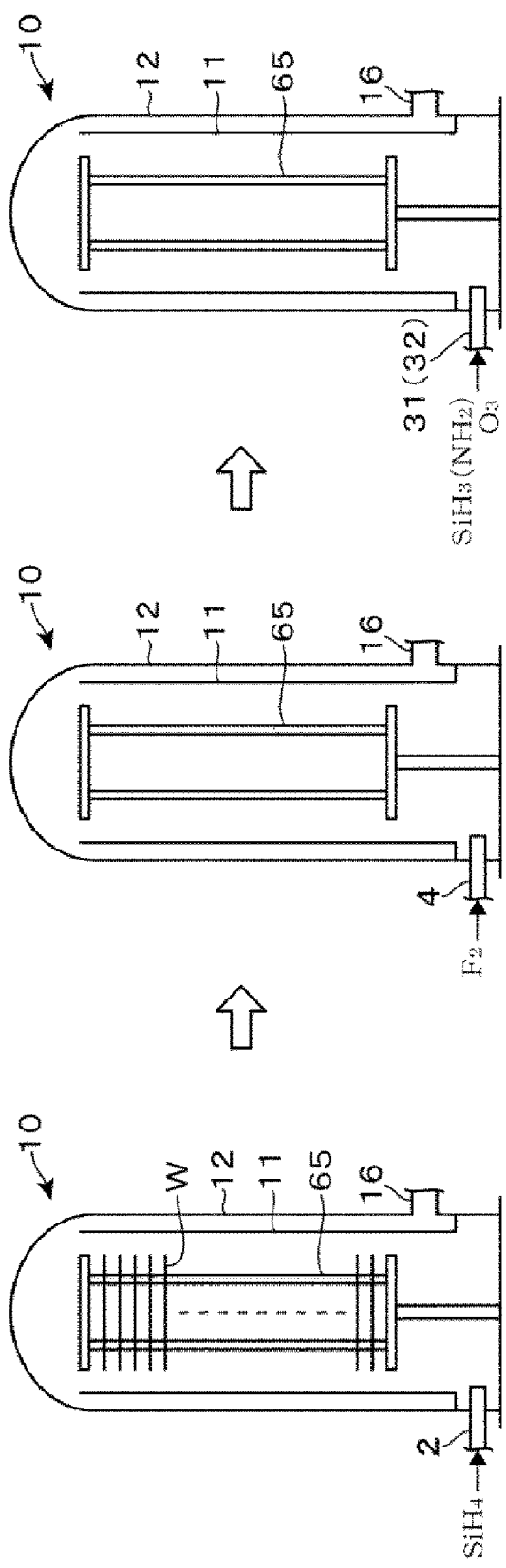

FILM FORMING METHOD AND VERTICAL THERMAL PROCESSING APPARATUS

CROSS-REFERENCE TO RELATED APPLICATION

This application is based upon and claims the benefit of priority from Japanese Patent Application No. 2017-066088, filed on Mar. 29, 2017, the entire contents of which are incorporated herein by reference.

TECHNICAL FIELD

The present disclosure relates to a technique for collectively performing a film formation process on a plurality of target substrates inside a vertical reaction container.

BACKGROUND

A vertical thermal processing apparatus for collectively processing a plurality of semiconductor wafers (hereinafter referred to as "wafers") is used in a semiconductor manufacturing process for forming a film. Operation of the vertical thermal processing apparatus begins by loading a substrate holder holding a plurality of substrates in a shelf shape into a vertical reaction container surrounded by a heating part from a lower opening of the reaction container, covering the opening with a lid, and supplying a processing gas into the reaction container.

In such an apparatus, a lot of particles adhere to a bottom portion inside the reaction container, especially an inner surface of the lid. The reasons for this are considered to be that many quartz members are present inside the reaction container, particles are dropped to the bottom under the force of gravity, a mechanism for opening and closing the lid is placed near the bottom portion of the reaction container, and deposits adhering to the inside of an exhaust pipe return into the reaction container.

For example, in an apparatus for cleaning the inside of a reaction container by a cleaning gas each time when a film is formed on a substrate, a heater may be provided in a lid to prevent liquefaction of the cleaning gas at the time of cleaning. However, a temperature of the lid and its vicinity is much lower than a processing temperature in a processing atmosphere. Therefore, when the substrate is subjected to a film forming process such as, for example, CVD (Chemical Vapor Deposition) or the like, a film does not adhere to the bottom portion inside the reaction container.

As such, the particles (foreign substances) adhering to the bottom portion inside the reaction container are free to move. When the lid is opened, the particles are moved upward by an airflow generated due to a slight pressure difference between the inside and the outside of the reaction container. This may cause wafer contamination. In the past, the inner surface of the lid was manually cleaned regularly. This increases the burden for workers, which results in a reduction in the operation efficiency of the apparatus.

For example, a technique has been used for forming a polysilicon film as a pre-coating film inside a reaction container at 600 degrees C., prior to performing an epitaxial growth on a wafer using a vertical thermal processing apparatus. However, the pre-coating film is used for protecting a quartz member from a hydrogen fluoride gas for removal of a natural oxide film and is not formed on the bottom portion of the reaction container kept at a low temperature. Therefore, the aforementioned technique is not a technique that suggests the present disclosure.

SUMMARY

Some embodiments of the present disclosure provide a technique capable of reducing particle contamination when a film is formed on a target substrate by a vertical thermal processing apparatus.

According to one embodiment of the present disclosure, there is provided a film forming method of performing a film formation on a plurality of target substrates in a state in which a substrate holder configured to hold the plurality of target substrates in a shelf shape is loaded into a vertical reaction container around which a heating part is disposed from a lower opening of the vertical reaction container and the lower opening is closed by a lid, the method including: a film forming step of performing the film formation on the plurality of target substrates by supplying a processing gas into the vertical reaction container; subsequently, a step of opening the lid and unloading the substrate holder from the vertical reaction container; subsequently, a coating step of performing the film formation on a bottom portion of the vertical reaction container including an inner surface of the lid by closing the lower opening with the lid and supplying a coating gas different from the processing gas into the vertical reaction container; and subsequently, a step of performing the film formation on the plurality of target substrates by opening the lid, loading the substrate holder configured to hold the plurality of target substrates in the shelf shape into the vertical reaction container, and supplying the processing gas into the vertical reaction container.

According to another embodiment of the present disclosure, there is provided a vertical thermal processing apparatus of performing a film formation on a plurality of target substrates in a state in which a substrate holder configured to hold the plurality of target substrates in a shelf shape is loaded into a vertical reaction container around which a heating part is disposed from a lower opening of the vertical reaction container and the lower opening is closed by a lid, the apparatus including: a processing gas supply path through which a processing gas for performing the film formation on the plurality of target substrates is supplied into the vertical reaction container; a coating gas supply path through which a coating gas is supplied into the vertical reaction container; a vacuum exhaust mechanism configured to evacuate an interior of the vertical reaction container; and a controller configured to execute a film forming step of performing the film formation on the plurality of target substrates, subsequently a step of opening the lid to unload the substrate holder from the vertical reaction container, subsequently a coating step of performing the film formation on at least an inner surface of the lid by closing the lower opening with the lid and supplying the coating gas into the vertical reaction container, and subsequently, a step of performing the film formation on the plurality of target substrates by opening the lid to load the substrate holder configured to hold the plurality of target substrates into the vertical reaction container.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 3A to 3C are explanatory views stepwise showing an embodiment of a film forming method according to the present disclosure.

FIGS. 4D to 4F are explanatory views stepwise showing the embodiment of the film forming method according to the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
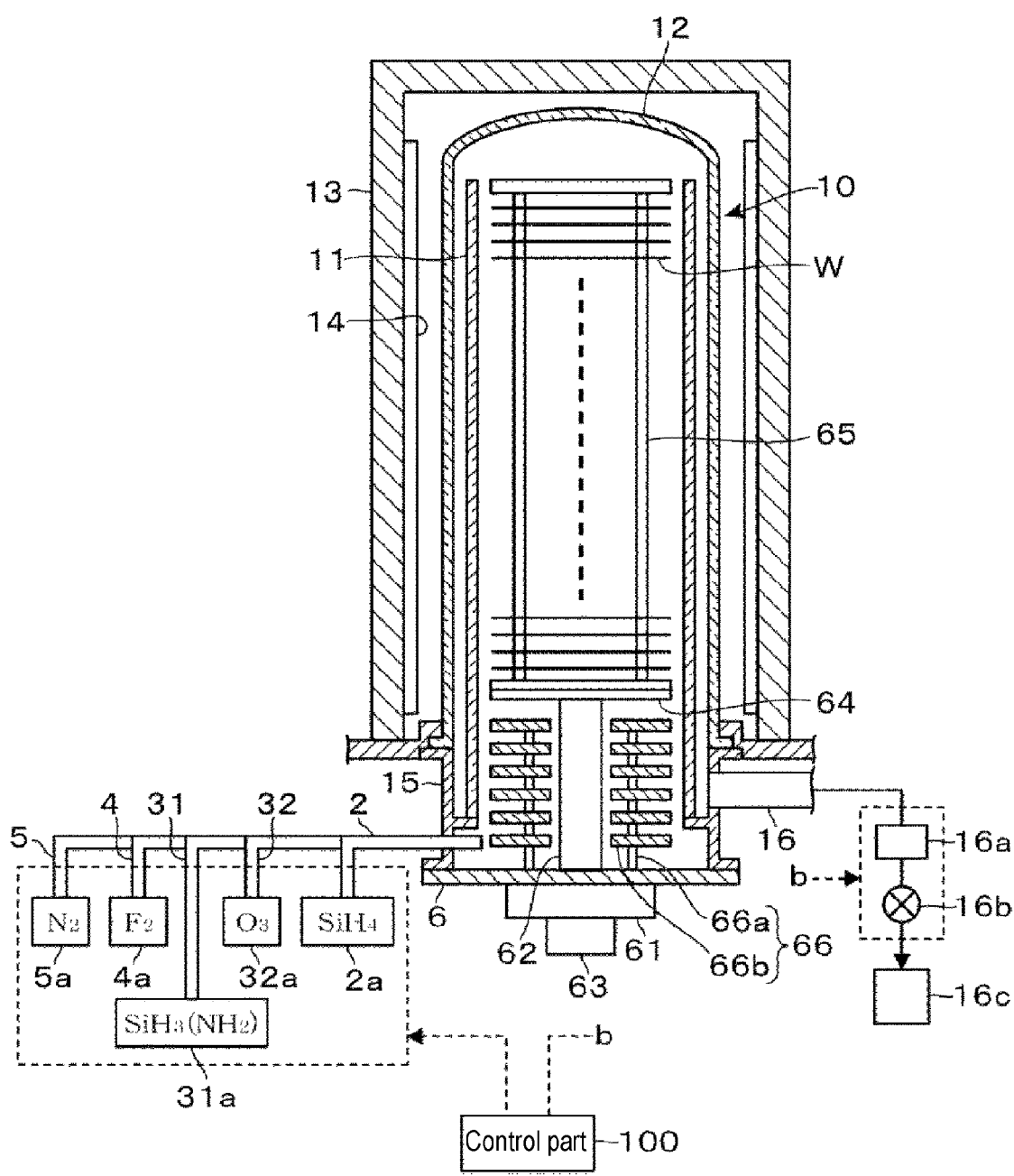
FIG. 1 is a vertical sectional view showing a vertical thermal processing apparatus according to an embodiment of the present disclosure.

As shown in FIG. 1, the vertical thermal processing apparatus according to the embodiment of the present disclosure is provided with a reaction tube of a double-tube structure including a cylindrical quartz-made inner tube 11 and a quartz-made outer tube 12 provided so as to surround the inner tube 11 and having a closed upper surface. A cylindrical outer casing 13 is provided around the outer tube 12. A heater 14 is provided on an inner peripheral surface of the outer casing 13. For example, the heater 14 is divided into a plurality of regions in the vertical direction, and power control is performed independently for each of the divided height regions. In FIG. 1, the heater 14 is illustrated as a schematic diagram.

Figure 2:
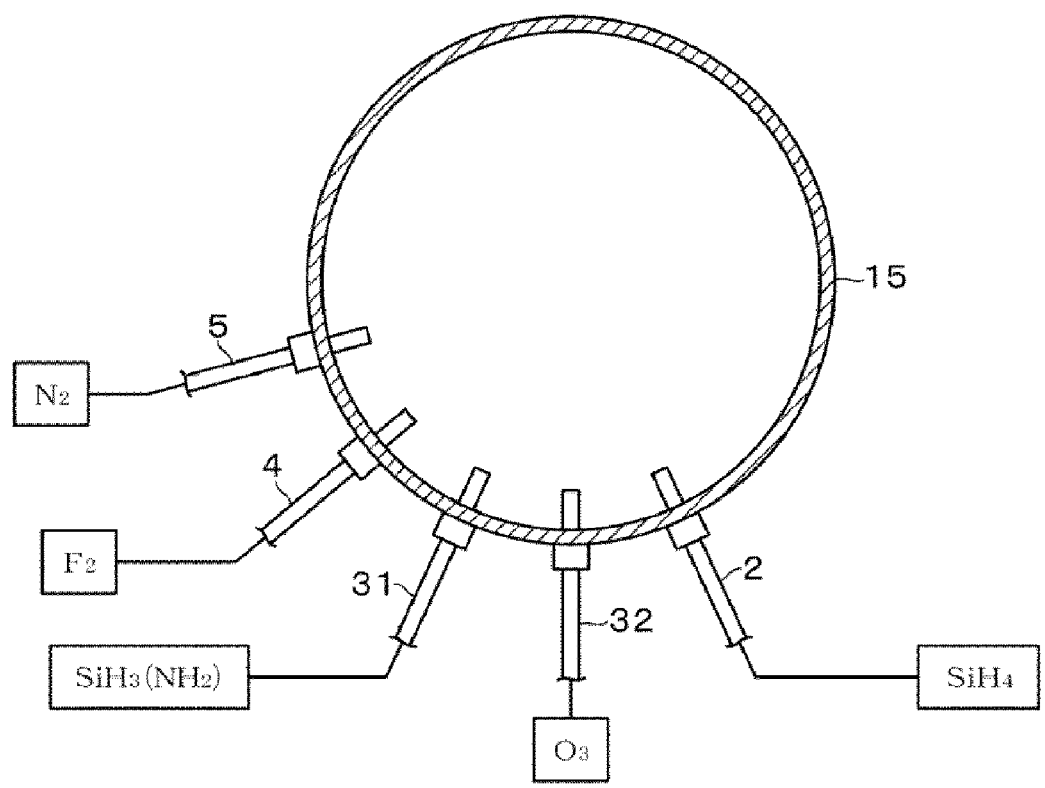
FIG. 2 is a transverse plan view showing a positional relationship between a manifold and gas supply pipes in the vertical thermal processing apparatus.

A metallic manifold 15 is provided under the inner tube 11 and the outer tube 12. A reaction container 10 is configured by the inner tube 11, the outer tube 12 and the manifold 15. Gas supply pipes as gas supply paths opened near the bottom portion of the inner tube 11 are provided in a lower portion of the manifold 15. In this example, as the gas supply pipes, there are provided a gas supply pipe 2 for performing film formation on the wafers W which will be described later, gas supply pipes 31 and 32 for coating the bottom portion of the reaction container 10, a cleaning gas supply pipe 4 and a gas supply pipe 5 for purging the interior of the reaction container 10. The respective gas supply pipes 2, 31, 32, 4 and 5 are arranged along a circumferential direction of the manifold 15 as shown in FIG. 2.

In this example, it is assumed that a polysilicon (Si) film is formed on the wafer W, and the bottom portion of the reaction container 10 is coated with a silicon oxide film ($SiO_2$ film). Examples of a gas used for forming the polysilicon film may include a monosilane ($SiH_4$) gas, a dichlorosilane ($SiH_2Cl_2$) gas and the like. A base end of the gas supply pipe 2 is connected to a monosilane gas supply source 2a. Examples of a gas used for coating with the silicon oxide film may include a silane gas having an amino group, for example, an aminosilane gas ($SiH_3(NH_2)$), and an oxidizing gas, for example, an ozone ($O_3$) gas. Base ends of the gas supply pipes 31 and 32 are connected to an aminosilane gas supply source 31a and an ozone ($O_3$) gas supply source 32a, respectively.

For example, a fluorine ($F_2$) gas is used as a cleaning gas for cleaning the interior of the reaction container 10. A base end of the gas supply pipe 4 is connected to a fluorine gas supply source 4a. For example, a nitrogen ($N_2$) gas is used as the purge gas. A base end of the gas supply pipe 5 is connected to a nitrogen gas supply source 5a.

Each of the gas supply sources 2a, 31a, 32a, 4a and 5a shown in FIG. 1 includes a gas cylinder, and a gas supply control device such as a valve and a flow meter. Each of the gas supply control devices is controlled by a control signal provided from a control part 100 composed of a computer.

One end of an exhaust pipe 16 opened to the external atmosphere of the outer tube 12 is connected to an upper region of the manifold 15. The other end of the exhaust pipe 16 is connected to a vacuum pump 16c as a vacuum evacuation mechanism via a pressure regulation valve 16a and a valve 16b. The pressure regulation valve 16a and the valve 16b are controlled by the control part 100.

The vertical thermal processing apparatus further includes a lid (cap) 6 for opening and closing an opening formed at the lower end of the reaction container 10 (a lower end opening of the manifold 15). The lid 6 is fixedly provided on a boat elevator 61 as an elevating stand. The lid 6 is provided with an auxiliary heater which is a heating part (not shown). A rotating shaft 62 is vertically provided in the central portion of the lid 6. The rotating shaft 62 is rotated around a vertical axis by a rotation mechanism 63 provided in the boat elevator 61. A rotary table 64 is provided at the top of the rotating shaft 62. A quartz-made wafer boat 65 as a substrate holder for holding a plurality of wafers W as target substrates in a shelf shape, is mounted on the rotary table 64.

A heat insulating unit for thermally insulating a processing atmosphere, for example, a heat insulating unit 66 constituted by stacking ring-shaped quartz plates 66b on a frame body 66a in a shelf shape, is provided between the wafer boat 65 and the lid 6. The heat insulating unit 66 may also be referred to as a heat insulating part for thermally insulating the processing atmosphere from the outside.

Software for controlling a series of operations of the vertical thermal processing apparatus is installed in a program storage part (not shown) of the control part 100 via a storage medium such as a compact disk, a hard disk, an MO disk (magneto-optical disk), a memory card, or the like.

The above embodiment will now be described. It is assumed that, as shown in FIG. 1, the wafer boat 65 which holds a plurality of, e.g., 100 wafers W in a shelf shape is loaded into the reaction container 10 by the upward movement of the boat elevator 61. First, the interior of the reaction container 10 is evacuated by the vacuum pump 16c via the exhaust pipe 16. The temperature of the processing atmosphere of the reaction container 10 (the atmosphere in the region where the wafers W are disposed) is increased to a processing temperature of, for example, 620 degrees C. by the heater 14. Then, while maintaining the interior of the reaction container 10 at a pressure of, for example, 266 Pa by the pressure regulation valve 16a, a silane-based gas, for example, a monosilane gas, which is a processing gas, is supplied into the reaction container 10 from the gas supply pipe 2.

The monosilane gas is discharged to the vicinity of the bottom portion of the reaction container 10 and then moved upward while being heated. A polysilicon film is formed on the wafer W by a CVD-based reaction. During the film formation, the wafer boat 65 is being rotated. After a period of processing time corresponding to a film thickness of the polysilicon film of, for example, 100 nm, the supply of the monosilane gas is stopped and, for example, the supply of electric power to the heater 14 is stopped. Furthermore, a nitrogen gas as a purge gas is supplied from the nitrogen gas supply pipe 5 into the reaction container 10. When the polysilicon film is formed using the silane-based gas, a hydrogen gas may be added at the same time.

After an internal pressure of the reaction container 10 returns to atmospheric pressure, the wafer boat 65 is moved down by the boat elevator 61 and is unloaded from the lower end opening of the reaction container 10 to a loading area. Then, for example, five wafers W are taken out from the wafer boat 65 by a transfer mechanism provided in the loading area and are transferred to a holding shelf.

Thereafter, the (empty) wafer boat 65 in which the wafers W are not mounted is moved upward by the boat elevator 61 and is loaded into the reaction container 10. The lower end opening of the reaction container 10 is closed by the lid 6. Subsequently, a fluorine ($F_2$) gas as a cleaning gas is supplied from the gas supply pipe 4 into the reaction container 10 to remove the polysilicon film formed on the inner wall of the reaction container 10 and the inner surfaces of the wafer boat 65 and the lid 6. At this time, the internal pressure of the reaction container 10 is set to, for example, 500 to 1,000 Pa.

The internal temperature of the reaction container 10 is set to a temperature selected from a range of, for example, 300 to 350 degrees C. The inner surface of the lid 6 is heated to, for example, 300 degrees C. by, for example, the auxiliary heater (not shown) provided in the lid 6 as described above, thereby preventing liquefaction of the fluorine gas.

Particles adhere to the inner surface of the lid 6 during cleaning. This is attributed as described in the Background section of the present disclosure, that minute quartz powder scatters from the quartz member into the reaction container 10 or deposits adhering to the inside of the exhaust pipe 16 flow backward so that such floating substances are dropped under the gravity.

FIGS. 3A and 4F schematically show the state of the apparatus, the state of the inner surface of the lid 6 and the state of the inner surface near the lower portion of the reaction container 10 in the respective steps performed by the vertical thermal processing apparatus. Since the temperature of the inner surface of the lid 6 is, for example, 350 degrees C., no polysilicon film is formed on the inner surface of the lid 6 in the film forming step as shown in the middle portion of FIG. 3A. A polysilicon film of a slight thickness is formed on the inner surface of the manifold 15 close to the lower portion of the reaction container 10, for example, the lowermost wafer W in the wafer boat 65. This state is shown in the lower portion of FIG. 3A.

In the explanation of FIGS. 3A and 4F, reference numeral 10a indicated in the lower portion denotes a section near the lower portion of the reaction container 10, which is referred to as a "bottom inner face." Reference numeral 70 denotes the polysilicon film. In a cleaning step, particles tend to adhere to the bottom portion of the reaction container 10. In this example, descriptions will be made under the assumption that particles P1 adhere to the inner surface of the lid 6 and the bottom inner surface 10a.

After the cleaning step is finished, a coating step is performed in which a silicon oxide film ($SiO_2$ film) is formed inside the reaction container 10 by so-called ALD (Atomic Layer Deposition) using an aminosilane ($SiH_3$ ($NH_2$)) gas as a coating gas and an ozone ($O_3$) gas as an oxidizing gas, which are supplied from the gas supply pipes 31 and 32, respectively. That is to say, a step of supplying the aminosilane gas, a step of supplying a nitrogen gas as a purge gas into the reaction container 10 and evacuating the interior of the reaction container 10 to replace an atmosphere, a step of supplying the ozone gas, and the aforementioned replacement step are repeated a plurality of times.

As a result, the aminosilane gas is adsorbed inside the reaction container 10 and is then oxidized by the ozone gas to form a molecular layer of silicon oxide which is a reaction product. The molecular layers thus formed are stacked up. The internal pressure of the reaction container 10 at the time of supplying the raw material gas and supplying the oxidizing gas in the coating step is, for example, 70 Pa. The internal temperature of the reaction container 10 is set to a temperature selected from, for example, 250 to 400 degrees C. In this example, the interior of the reaction container 10 is heated at the same temperature (e.g., 300 degrees C.) as that in the cleaning step by the auxiliary heater provided in the lid 6.

Since the film formation of the silicon oxide film in the coating step is performed at such a low temperature, the silicon oxide film 71 is also coated (formed) on the bottom inner surface 10a of the reaction container 10 and the inner surface of the lid 6. The film thickness of the silicon oxide film 71 is set to, for example, 10 nm. Therefore, as shown in FIG. 3C, the particles P1 are fixed by the silicon oxide film 71 and come into an immovable state.

Thereafter, the interior of the reaction container 10 is replaced with the nitrogen gas and is returned to atmospheric pressure. Subsequently, the wafer boat 65 is moved down and is unloaded from the reaction container 10. The wafers W as target substrates to be processed subsequently are transferred to the wafer boat 65 by the transfer mechanism. Upon completing the transfer of the wafers W to the wafer boat 65, the wafer boat 65 is moved upward and is loaded into the reaction container 10. The polysilicon film is formed as described above. Thereafter, the same steps as described above are repeated.

FIGS. 4D to 4F show the state of a series of steps following the step shown in FIG. 3C. In a polysilicon film forming step, as shown in FIG. 4D, the polysilicon film 70 is formed on the silicon oxide film 71 of the bottom inner surface 10a of the reaction container 10. Then, in a cleaning step, the polysilicon film 70 is removed. However, particles adhere to the inner surface of the lid 6 and the bottom inner surface 10a. In FIG. 4E, for the sake of convenience in illustration, there is shown a state in which particles P2 adhere to the inner surface of the lid 6 and the bottom inner surface 10a. Furthermore, a silicon oxide film is formed (coated), and a silicon oxide film 72 is coated on the particles P1 and P2. Therefore, the particles P2 are fixed by the silicon oxide film 72.

The particles sequentially adhering to the inner surface of the lid 6 and the bottom inner surface 10a of the reaction container 10 in this manner are fixed by the silicon oxide film 72 and come into an immovable state. The series of steps described above is executed by the software including a process recipe stored in a memory of the control part 100.

According to the above embodiment, a film is formed on the bottom portion inside the reaction container in a state in which the wafers W are not present inside the reaction container 10, so that the particles adhering to the bottom portion including the inner surface of the lid 6 are fixed by the silicon oxide film. Therefore, even if an airflow is generated by the pressure difference between the inside and the outside of the reaction container 10 when the lid 6 is opened, the particles are less likely to move upward. It is therefore possible to reduce particle contamination on the wafers W.

Further, the operator does not need to clean the inner surface of the lid 6 to remove particles or the frequency of work is reduced. Therefore, it is possible to alleviate the burden on the operator and to suppress a decrease in the operation rate of the apparatus.

The cleaning step and the coating step can be performed, for example, at the same temperature. Therefore, it is possible to immediately perform the coating step without changing the internal temperature of the reaction container 10 after the cleaning step. This makes it possible to suppress a reduction in throughput which may otherwise be caused by the addition of the coating step.

Furthermore, in the cleaning with the fluorine gas, the selectivity between the polysilicon film and the silicon oxide film is large. Therefore, there is also an advantage that the coated particles are less likely to scatter again.

The coating step will now be described. In the coating step, it is necessary that a thin film be formed (deposited) on the bottom portion of the reaction container 10 in addition to the inner surface of the lid 6. The temperature of the inner surface of the manifold 15 corresponding to the bottom portion of the reaction container 10 is about 400 degrees C. at a maximum even when the auxiliary heater is provided in the lid 6. The temperature of the inner surface of the lid 6 is further lower and is, for example, 300 to 350 degrees C. For example, when a silicon oxide film is formed using TEOS (tetraethoxysilane) as a raw material, the decomposition temperature of TEOS is 550 degrees C. Therefore, no film is formed in the bottom portion of the reaction container 10.

Accordingly, in the coating step, it is necessary to perform a process capable of forming a film even at such a low temperature. The expression "process capable of forming a film" is not limited to being able to form a film with the same film thickness as that in the processing atmosphere inside the reaction container 10. For example, when a certain film forming process is performed inside the reaction container 10 for a predetermined period of time, assuming that a film thickness of the thin film formed on the substrate arranged in the processing atmosphere is TS and a film thickness of the thin film formed on the inner surface of the lid 6 is TB, there may be, for example, a case where TB≥0.1 TS. That is to say, the film thickness TB of the thin film formed on the inner surface of the lid 6 may be 10% or more of the film thickness TS of the thin film formed in the processing atmosphere.

In this case, assuming that a film thickness of the thin film formed on the wafer W in a state in which the wafer W is loaded into the reaction container 10 is TS' and a film thickness of the thin film formed on the inner surface of the lid 6 is TB', when the film forming step performed for the wafer W is satisfied in relation to TB'<0.1 TS', the coating process is effective.

The numerical value of 10% mentioned above is one example of a value which may be assumed from the viewpoint of effectively fixing the particles adhering to the inner surface of the lid 6 and the viewpoint of not remarkably reducing the throughput as the time period of the coating step becomes too long. However, the present disclosure is a technique of fixing particles by performing the coating step which is a process different from the film forming process performed on the wafer W. Therefore, the above ratio [(TB/TS)×100%] is not limited to 10% or more.

The ratio of TS to TB may be 20% or more, especially 30% or more. In the case of the above-described silicon oxide film formed using the aminosilane gas and the ozone gas, the ratio may be substantially TB=0.6 TS, namely about 60%, which is a very appropriate process. Even when the film thickness TB is less than 10% of the film thickness TS, the coating step may be effective depending on the operation of the apparatus. Such a coating step may include an example in which a silicon nitride ($Si_2N_3$) film is formed by an ALD method using, for example, a dichlorosilane ($SiH_2Cl_2$) gas and an ammonia gas. In this case, the above ratio is substantially 4 to 6%.

In the above-described embodiment, the ALD is performed using the aminosilane gas and the ozone gas. In some embodiments, CVD may be performed by simultaneously supplying the aminosilane gas and the ozone gas into the reaction container 10. In the case of using a silicon oxide film for coating, the Si-containing gas which is a raw material gas is not limited to aminosilane and aminodisilane but may be dichlorosilane [DCS], monosilane ($SiH_4$), disilane ($Si_2H_6$), hexachlorodisilane ($Si_2Cl_6$) [HCD], hexamethyldisilazane [HMDS], trichlorosilane ($SiHCl_3$) [TCS], disilylamine [DSA], trisilylamine [TSA], bis(tertiary-butylamino)silane [BTBAS], (($CH_3)_3SiH$) [trimethyl silane], (($CH_3)_3SiN_3$) [trimethyl silylazide], ($SiF_4$), ($SiCl_3F$), ($SiI_4$), ($Si_2F_6$) and the like.

The film forming process used in the coating step may be a process of forming an aluminum oxide ($Al_2O_3$) film using TMA (trimethylaluminum) and an ozone gas, or a process of forming a hafnium oxide ($HfO_2$) film using TDMAH (tetrakisdimethylamide hafnium) and an ozone gas. The aluminum oxide film may be formed, for example, at a temperature ranging room temperature to 500 degrees C. The hafnium oxide film may be formed, for example, at a temperature ranging from 200 to 300 degrees C. The above ratio related to the aluminum oxide film and the hafnium oxide film is 50% or more. That is to say, the film is formed on the inner surface of the lid 6 with a film thickness of one half or more of the film thickness of the film formed on the wafer.

While in the above example, CVD has been described to be performed on the wafer W to form the polysilicon film, the film formation performed on the wafer W may be a step of using the aforementioned ALD method in which a raw material gas and a reaction gas are alternately supplied into the reaction container 10.

Further, the thin film formed on the wafer W is not limited to the polysilicon film but may be, for example, a silicon oxide film or a silicon nitride film. The silicon oxide film may be formed by, for example, using TEOS as a raw material and supplying an oxygen gas or an ozone gas as an oxidizing gas into the reaction container 10. In this case, even if the gases used in both the film forming step and the coating step are the same in terms of the oxidizing gas, the combinations of the gases used for film formation are different from each other. Thus, the gases used in both the film forming step and the coating step are different from each other.

While in the above embodiment, the cleaning step has been described to be performed each time (every time) when the film forming process is performed on the wafer W, the cleaning step may be performed after the film forming process on the wafer W is performed a plurality of times, for example, after the film forming process on the wafer W is repeatedly performed until an accumulated film thickness reaches a set film thickness. In this case, the coating step may be performed each time when the cleaning step is performed, or may be performed every time.

The present disclosure may also be applied to a case where the cleaning step is not performed. In that case, the coating step may be performed in a state in which the wafer boat 65 is not present inside the reaction container 10, or may be performed in a state in which, as in the above-described embodiment, the wafers W subjected to film formation are transferred from the wafer boat 65 and the empty wafer boat 65 is loaded into the reaction container 10.

The configuration in which the gas is supplied to the wafer W is not limited to the configuration in which the gas supply pipes are opened in the bottom portion of the reaction container 10 as in the above-described embodiment. For example, it may be possible to adopt a structure in which a gas supply pipe is arranged in the vertical direction to extend along the wafer boat 65 from the bottom portion of the reaction container 10 and a gas is discharged from a plurality of gas discharge holes formed in the gas supply pipe along the vertical direction, for example, a plurality of gas discharge holes respectively formed at the height positions corresponding to the respective wafers W mounted on the wafer boat 65. This example is an example in which a gas nozzle called a distribution injector or the like is used. The supply of the gas for coating is not limited to the configuration in which the gas supply pipes are opened in the bottom portion of the reaction container 10, the distribution injector may be used.

Furthermore, in the coating step, particularly when film formation (formation of a coating film) is not required in the processing atmosphere inside the reaction container 10, the temperature of the processing atmosphere may be lowered, and only the bottom portion of the reaction container 10 may be heated to a temperature for performing the coating.

According to the present disclosure, a film is formed on a bottom portion of a reaction container in a state in which a target substrate is not present in the reaction container, so that particles on the bottom portion including an inner surface of a lid are fixed. Therefore, it is possible to reduce particle contamination of the target substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method of performing a film formation on a plurality of target substrates and on an inner surface of a vertical reaction container in a state in which a substrate holder configured to hold the plurality of target substrates in a shelf shape is loaded into the vertical reaction container around which a heating part is disposed from a lower opening of the vertical reaction container and the lower opening is closed by a lid, the method comprising:

a first film forming step of forming a thin film on a batch of a plurality of target substrates held by the substrate holder by closing the lower opening with the lid and supplying a processing gas into the vertical reaction container;

subsequently, a step of opening the lid and unloading the substrate holder holding the batch of the plurality of target substrates from the vertical reaction container;

subsequently, a coating step of forming a coating film on a bottom portion of the vertical reaction container including an inner surface of the lid by closing the lower opening with the lid and supplying a coating gas different from the processing gas into the vertical reaction container; and subsequently, a second film forming step of forming the thin film on a new batch of a plurality of target substrates by opening the lid, loading the substrate holder configured to hold the new batch of the plurality of target substrates in the shelf shape into the vertical reaction container, and supplying the processing gas into the vertical reaction container.

2. The method of claim 1, wherein, assuming that, when the act of forming the coating film is performed in a state in which the plurality of target substrates is loaded into the vertical reaction container, a film thickness of the coating film formed on each of the plurality of target substrates is TS, and a film thickness of the coating film formed on the inner surface of the lid is TB, a relation of TB≥0.1 TS is satisfied.

3. The method of claim 1, further comprising: after the batch of the plurality of target substrates held by the substrate holder subjected to the first film forming step is unloaded from the vertical reaction container, loading the substrate holder which does not hold the batch of the plurality of target substrates into the vertical reaction container, and cleaning an interior of the vertical reaction container with a cleaning gas, followed by performing the coating step.

4. The method of claim 1, wherein, when the act of forming the coating film is performed in a state in which the plurality of target substrates is loaded into the vertical reaction container, a film thickness of the coating film formed on each of the plurality of target substrates is TS', and a film thickness of the coating film formed on the inner surface of the lid is TB', a relation of TB'<0.1 TS' is satisfied.

5. The method of claim 1, wherein the coating step is performed in a state in which the inner surface of the lid has a temperature of 350 degrees C. or lower.

6. The method of claim 1, wherein the coating step includes forming a silicon oxide film using a raw material gas which is a silane gas containing an amino group and an oxidizing gas.

7. The method of claim 1, wherein the coating step includes depositing a reaction product by performing, a plurality of times, a process of supplying a raw material gas into the vertical reaction container so as to be adsorbed inside the vertical reaction container and subsequently, supplying a reaction gas reacting with the raw material gas into the vertical reaction container.

* * * * *

UNITED STATES PATENT AND TRADEMARK OFFICE
CERTIFICATE OF CORRECTION

PATENT NO.         : 10,573,518 B2
APPLICATION NO.    : 15/933760
DATED              : February 25, 2020
INVENTOR(S)        : Yoshikazu Furusawa Page 1 of 1

It is certified that error appears in the above-identified patent and that said Letters Patent is hereby corrected as shown below:

Claim 2, Column 10, Line 20, please delete the phrase "assuming that".

Signed and Sealed this
Seventh Day of April, 2020

Andrei Iancu
*Director of the United States Patent and Trademark Office*